United States Patent
Palacios et al.

(10) Patent No.: US 8,921,892 B2
(45) Date of Patent: Dec. 30, 2014

(54) HIGH-PERFORMANCE NITRIDE SEMICONDUCTOR DEVICES

(75) Inventors: Tomas Apostol Palacios, Cambridge, MA (US); Jinwook Chung, Los Angeles, CA (US)

(73) Assignee: Massachusetts Institute of Technology, Cambridge, MA (US)

( * ) Notice: Subject to any disclaimer, the term of this patent is extended or adjusted under 35 U.S.C. 154(b) by 442 days.

(21) Appl. No.: 13/167,236

(22) Filed: Jun. 23, 2011

(65) Prior Publication Data
US 2012/0012894 A1    Jan. 19, 2012

Related U.S. Application Data

(60) Provisional application No. 61/358,607, filed on Jun. 25, 2010.

(51) Int. Cl.
*H01L 29/739* (2006.01)
*H01L 31/072* (2012.01)

(52) U.S. Cl.
USPC ............................ 257/194; 257/192; 257/288

(58) Field of Classification Search
USPC .............. 257/192, 194, 288, E21.09, E21.19, 257/E29.242, E29.246
See application file for complete search history.

(56) References Cited

U.S. PATENT DOCUMENTS

2007/0224710 A1 * 9/2007 Palacios et al. ................. 438/12
2010/0051980 A1   3/2010 Miki et al.

FOREIGN PATENT DOCUMENTS

JP   2008-010803     1/2008
KR   10-2009-0091868  9/2009

OTHER PUBLICATIONS

International Search Report and Written Opinion dated Jan. 17, 2012 from corresponding International Application No. PCT/US2011/041607, filed Jun. 23, 2011.
Chung, J.W. et al., "AlGaN/GaN HEMT With 300-GHz $f_{max}$," Electron Device Letters vol. 31, No. 3, Mar. 2010, pp. 195-197.
Higashiwaki, M. et al. "AlGaN/GaN Heterostructure Field-Effect Transistors on 4H-SiC Substrates with Current-Gain Cutoff Frequency of 190GHz," Applied Physics Express 1 (2008) pp. 021103-1-021103-3.
Micovic, M. et al. "GaN HFET for W-band Power Applications," IEEE, IEDM, 2006, 3 pages.
Wu, Y-F et al. "30-W/mm GaN HEMTs by Field Plate Optimization," IEEE Electron Device Letters, vol. 25, No. 3, Mar. 2004, pp. 117-119.

* cited by examiner

*Primary Examiner* — Hung Vu
(74) *Attorney, Agent, or Firm* — Wolf, Greenfield & Sacks, P.C.

(57) ABSTRACT

A method of forming a transistor over a nitride semiconductor layer includes surface-treating a first region of a nitride semiconductor layer and forming a gate over the first region. Surface-treating the first region can cause the transistor to have a higher intrinsic small signal transconductance than a similar transistor formed without the surface treatment. A portion of the bottom of the gate can be selectively etched. A resulting transistor can include a nitride semiconductor layer having a surface-treated region and a gate formed over or adjacent to the surface-treated region.

34 Claims, 12 Drawing Sheets

FIG. 11a

HIGH-PERFORMANCE NITRIDE SEMICONDUCTOR DEVICES

CROSS-REFERENCE TO RELATED APPLICATIONS

This application claims priority under 35 U.S.C. 119(e) to U.S. provisional application 61/358,607, filed Jun. 25, 2010, titled "TECHNOLOGIES TO IMPROVE HIGH FREQUENCY PERFORMANCE IN NITRIDE SEMICONDUCTOR," which is hereby incorporated by reference in its entirety.

STATEMENT REGARDING FEDERALLY SPONSORED RESEARCH OR DEVELOPMENT

This invention was made with government support under Contract No. N00014-05-1-0419 awarded by ONR and under Contract No. HR0011-10-C-0015 awarded by DARPA. The government has certain rights in this invention.

BACKGROUND

1. Field of Invention

The techniques described herein relate generally to semiconductor devices, and in particular to nitride semiconductor devices and techniques for improving the performance of nitride semiconductor transistors at high frequencies.

2. Discussion of the Related Art

The high breakdown field and electron velocity of AlGaN/GaN high electron mobility transistors (HEMTs) make these devices a good choice for power amplification at high frequencies. However, in spite of the recent progress in frequency performance, the performance and electron velocity of these devices have been well below the theoretical predictions.

SUMMARY

Some embodiments relate to a method of forming a transistor. The method includes surface-treating a first region of a nitride semiconductor layer, and forming a gate over and/or adjacent to at least a portion of the first region. Surface-treating the first region causes the transistor to have a higher frequency performance.

Some embodiments relate to a method of forming a transistor. The method includes surface-treating a first region of a nitride semiconductor layer, and forming a gate over and/or adjacent to at least a portion of the first region. Surface-treating the first region causes the transistor to have a higher intrinsic small signal transconductance for a frequency above DC.

Some embodiments relate to a method of forming a transistor. The method includes plasma-treating a first region of a nitride semiconductor layer using an oxygen plasma, and forming a gate over and/or adjacent to at least a portion of the first region.

Some embodiments relate to a method of forming a transistor. The method includes forming a nitride semiconductor layer, forming a gate comprising a first layer and a second layer such that the second layer is formed over the first layer and the first layer is formed over the nitride semiconductor layer, and selectively etching a portion of the first layer.

Some embodiments relate to a transistor that includes a nitride semiconductor layer comprising a surface-treated region. The transistor also includes a gate formed over and/or adjacent to at least a portion of the surface-treated region. The transistor has an intrinsic small-signal transconductance that increases or at least does not substantially decrease as a frequency of operation of the transistor is increased from 0 Hz to a frequency of at least one GHz.

Some embodiments relate to a transistor that includes a nitride semiconductor layer comprising a surface-treated region and a gate formed over and/or adjacent to at least a portion of the surface-treated region. A performance of the transistor does not substantially decrease as an operating frequency of the transistor is increased to a frequency of at least one GHz.

Some embodiments relate to a transistor that includes a nitride semiconductor layer comprising a surface-treated region and a gate formed over and/or adjacent to at least a portion of the surface-treated region. A current gain cut off frequency ($f_T$) of the transistor is at least about 200 GHz.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the invention.

DETAILED DESCRIPTION

We believe that a significant portion of the lower-than-expected high frequency performance of nitride semiconductor based devices, such as AlGaN/GaN HEMTs, is caused by a significant drop of the intrinsic small-signal transconductance ($g_m$) at high frequencies with respect to the intrinsic small-signal transconductance $g_m$ measured under DC conditions (approximately 0 Hz). We believe that the drop in $g_m$ at high frequencies is a result of defects and current leakage at the interface between the transistor gate and the underlying semiconductor.

We have demonstrated techniques that have allowed us to fabricate AlGaN/GaN HEMTs with a record current-gain cut off frequency ($f_T$) of 162 GHz for a gate length ($L_g$) of 110 nm, and 225 GHz with an $L_g$ of 55 nm. In one aspect, surface treatment of the semiconductor material can be performed underneath the gate electrode, prior to deposition of the gate material, or adjacent to the gate electrode (e.g., between the gate and the source, and/or between the gate and the drain), to remove defects in the semiconductor material. In another aspect, selective etching of the gate can be performed to remove portions of the gate at the bottom of the gate and create gaps or gate-recesses between the gate and the underlying semiconductor material. When used either alone or in combination, such techniques can significantly increase the high frequency performance of the devices.

FIGS. 1a-f illustrate a method of forming a gate in a manner that can increase the high frequency performance by using both plasma surface treatment and selective etching of the gate, according to some embodiments.

Figures 1A, 1B, 1D, 1E:
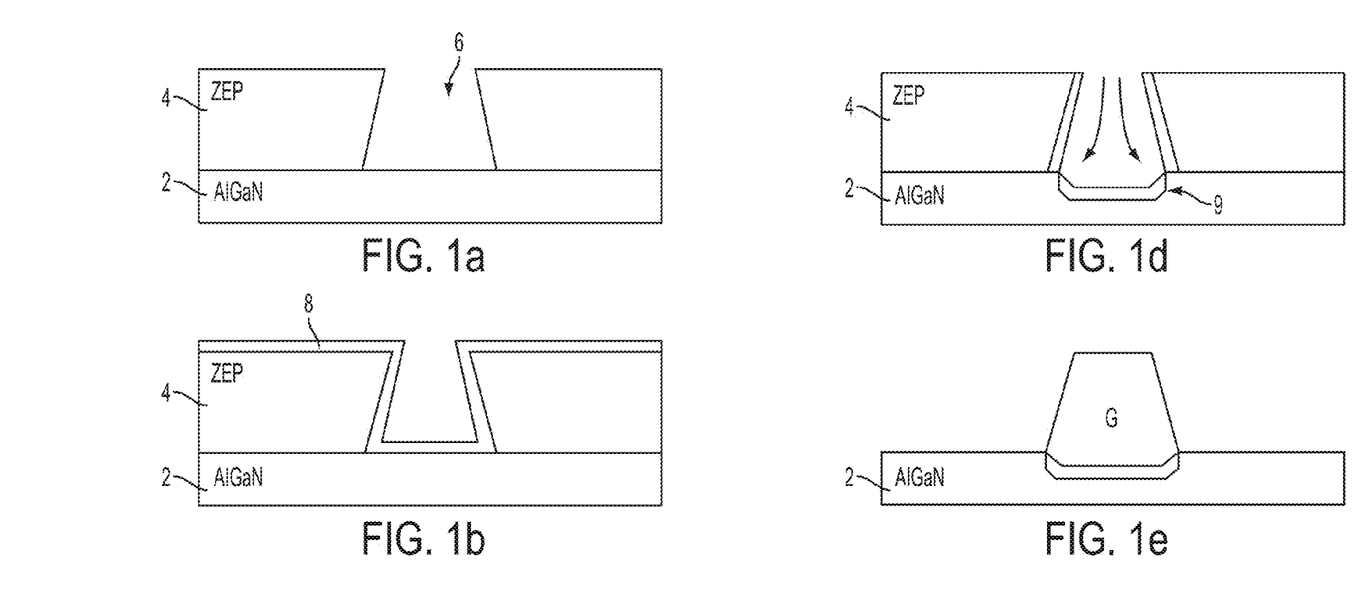
FIGS. 1a-f illustrate a method of forming a gate that can increase the high frequency performance of a transistor, according to some embodiments.

FIG. 1a shows a nitride semiconductor layer 2 on which is formed a photoresist layer 4. Nitride semiconductor layer 2 may be any suitable type of nitride semiconductor, such as AlGaN, for example, as shown in FIG. 1a. Photoresist layer 4 may be formed of any suitable type of photoresist or electron-beam sensitive resist. For example, photoresist layer 4 may be formed of a single ZEP resist layer. However, any suitable materials can be used for nitride semiconductor layer 2 and photoresist layer 4, as the techniques described herein are not limited in this respect. As shown in FIG. 1a, a sub-micron gate region 6 may be patterned by 30-keV electron-beam lithography of photoresist layer 4, for example. However, any suitable type of patterning may be used. Gate region 6 may have any suitable size depending on the chosen gate length.

FIG. 1b shows that the patterned photoresist layer 4 can be covered by a thin passivation layer 8. As an example, passivation layer 8 may be formed of $Al_2O_3$, which can be deposited by atomic layer deposition in a thickness of 10 nm. A deposition temperature of 80° C. may be used to prevent reflow of the ZEP. However, any suitable material and thickness or technique/parameters may be used for the deposition of passivation layer 8, as the techniques described herein are not limited as to a particular material or deposition technique for passivation layer 8.

Figure 1C:
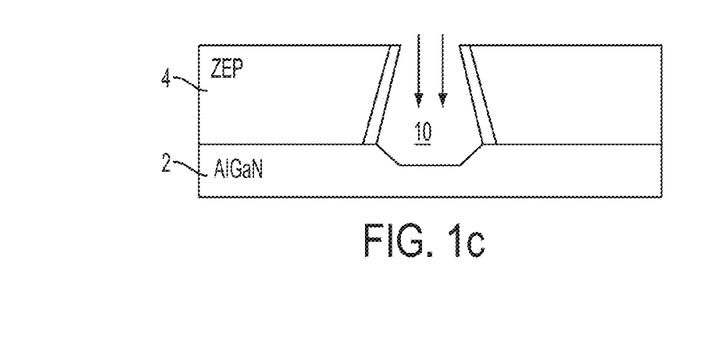

As shown in FIG. 1c, a gate recess 10 can then be formed in the nitride semiconductor layer 2. For example, low-power anisotropic $Cl_2/BCl_3$-based electron cyclotron resonance reactive ion etching (ECR-RIE) or any other suitable process can be used to form the gate recess 10.

In some embodiments, a surface treatment can be performed to passivate the surface of nitride semiconductor layer 2. If the optional gate recess 10 is used, the surface treatment may be performed after forming gate recess 10. As an example, surface treatment may include performing a plasma treatment using $O_2$ gas. An example of a suitable oxygen plasma treatment may include applying oxygen plasma for 45 min in a Bronson asher with 800 W of power. When an oxygen plasma treatment is used, the remaining sidewalls of the passivation layer 8 can protect the photoresist layer 4 from the oxygen plasma, thereby preserving the original gate length defined by the lithography. It is noted that the surface treatment to improve the $g_m$-collapse and the frequency performance of the devices could be performed in a manner different from oxygen plasma, for example, plasma treatment with other gases ($H_2$, Ar, $BCl_3$, $Cl_2$, $CHF_3$, $CF_4$, etc), UV ozone cleaning, plasma-assisted high-k dielectric deposition, etc. Such a technique can be applied to a layer 2 formed of a material other than AlGaN, including any suitable nitride semiconductor such as binary, ternary, and quaternary compounds of semiconducting compounds formed between nitrogen and other elements in the periodic table, such as aluminum (Al), gallium (Ga), and/or indium (In), for example. As shown in FIG. 1d, the surface treatment of nitride semiconductor layer 2 creates a surface-treated region 9 having its structure modified to reduce defects therein. The surface properties of nitride semiconductor 2 at the surface-treated region 9 are thereby changed in a manner that can improve performance of the resulting transistor. If a plasma treatment is used, surface-treated region 9 can be referred-to as a plasma-treated region. Surface-treating region 9 can increase the speed of the transistor and/or the frequency at which the transistor is capable of operating.

As shown in FIG. 1e, a gate G can then be formed within the gate region 6. The gate may cover all or substantially all of the surface-treated region 9. In some embodiments, the gate G does not cover the entire surface-treated region 9, as illustrated in FIG. 1g. In some embodiments, the surface-treated region 9 may be formed only in the access regions outside the region covered by the gate electrode (e.g., adjacent to the gate electrode), as illustrated in FIG. 1h.

In some embodiments, the gate G may be formed of one or more layers of metal or other conductive material, such as a Ni/Au metal stack where a thin Ni layer is formed first and then a thicker Au layer is formed on the Ni layer. The Ni layer thereby forms the bottom of the gate opposite the region of the nitride semiconductor layer 2 in which the channel of the transistor is to be formed.

Figure 1F:
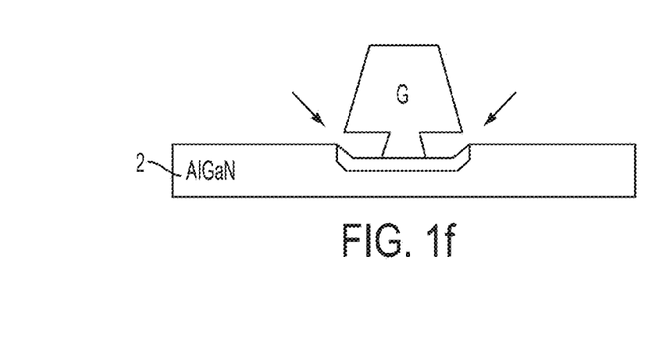
Figure 1G:
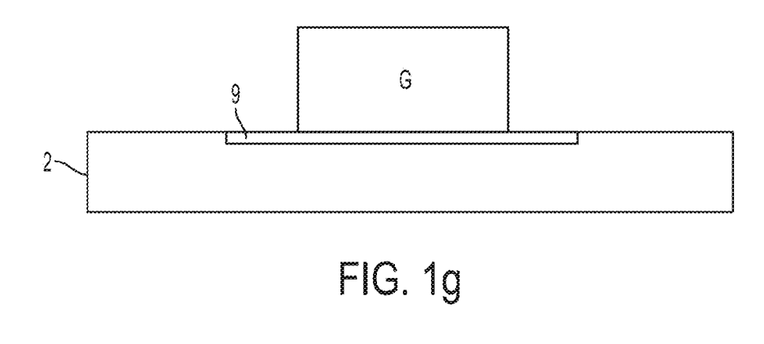
FIGS. 1g and 1h show other configurations of a surface treated region, according to some embodiments.
Figure 1H:
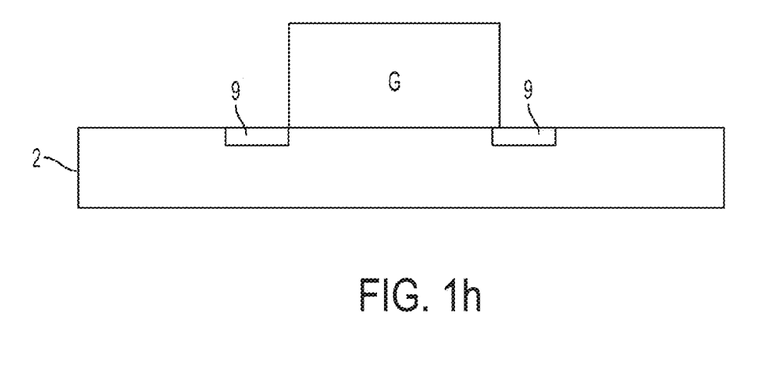

FIG. 1f shows that selective etching can be performed underneath the gate to remove metal from the regions at the bottom sides of the gate. For example, Ni etching can be performed to further reduce the physical gate length. The techniques described herein are not limited to performing etching underneath the gate, as this technique is optional.

Figure 2A:
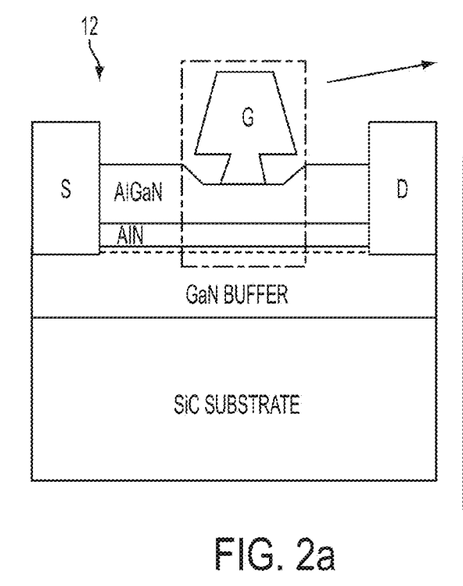
FIGS. 2a and 2b show a cross-section of an exemplary AlGaN/GaN HEMT.
Figure 2B:
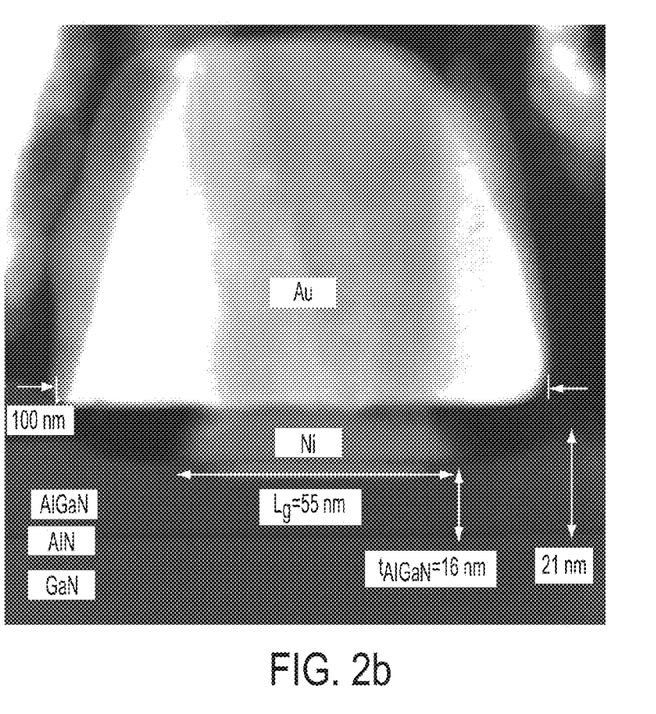

FIGS. 2a and 2b show a schematic cross-section of an exemplary AlGaN/GaN HEMT 12, and an STEM image, respectively, according to some embodiments. In this example, the physical gate length, $L_g$, after the lateral Ni etch is 55 nm. The AlGaN barrier thickness, $t_{AlGaN}$, after forming the vertical gate-recess is 16 nm (the 1 nm AlN spacer is not included in this thickness). In this example, device fabrication began with mesa isolation using a $Cl_2/BCl_3$ plasma-based dry etch. A new recessed ohmic contact metallurgy based on alloyed Si/Ge/Ti/Al/Ni/Au (2/2/20/100/25/50 nm) contacts was used.

Figure 3A:
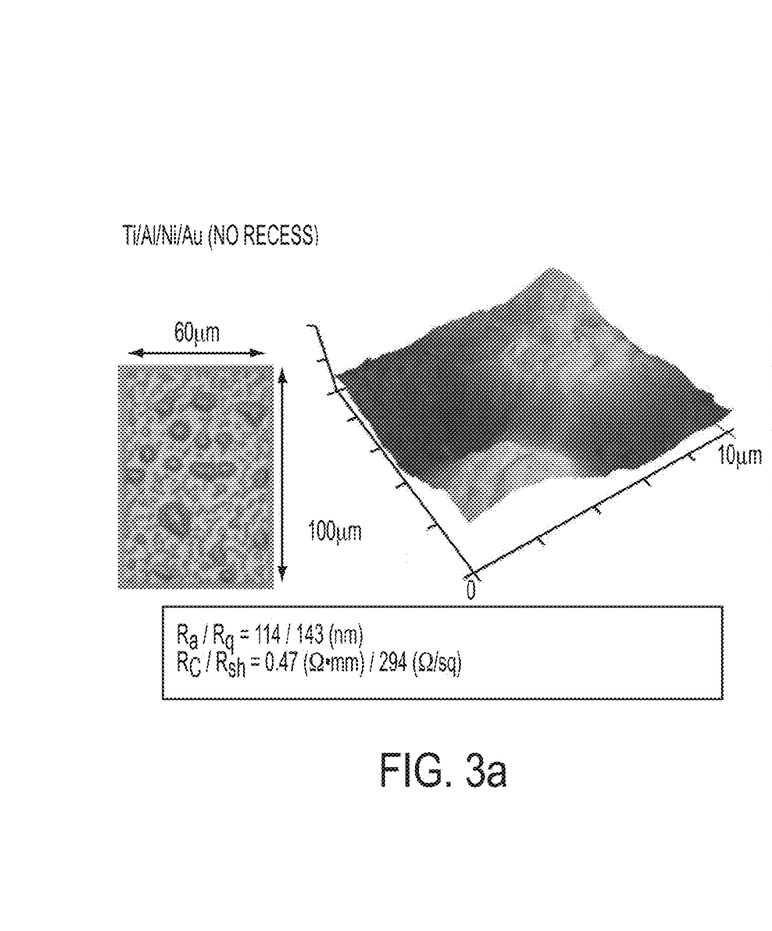
FIGS. 3a and 3b show that Si/Ge/Ti/Al/Ni/Au (2/2/20/100/25/50 nm) contacts reduced both ohmic contact resistance and surface roughness over conventional non-recessed Ti/Al/Ni/Au ohmic contacts.
Figure 3B:
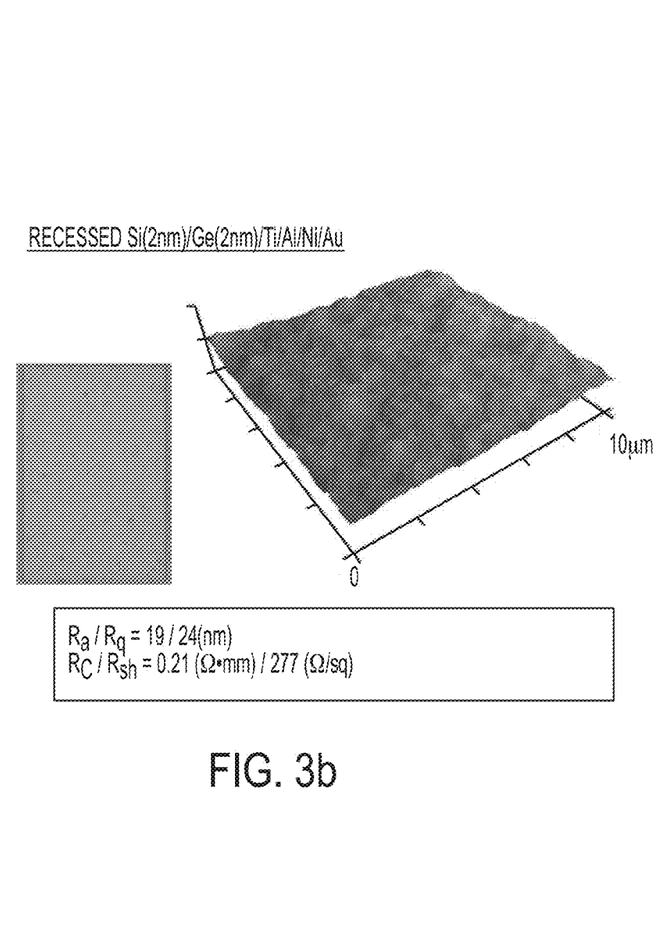

FIGS. 3a and 3b, respectively, illustrate the surface roughness with conventional non-recessed Ti/Al/Ni/Au ohmic contacts (FIG. 3a) and with the above-described ohmic contact metallurgy using alloyed Si/Ge/Ti/Al/Ni/Au (FIG. 3b). FIGS. 3a and 3b show AFM and optical images. The ohmic contact technique shown in FIG. 3b reduced both ohmic contact resistance (by 55%) and surface roughness (by 83%) over conventional non-recessed Ti/Al/Ni/Au ohmic contacts (FIG. 3a). Obtaining a smooth ohmic surface can significantly increase processing yield and reproducibility of the gate lithography, especially for short source-to-drain distances (<2 μm).

Table 1 shows X-ray photoelectron spectroscopy (XPS) measurements of the surface of AlGaN layer 2 before and after the oxygen plasma treatment shown in FIG. 1d. The oxygen plasma forms a thin $Ga_2O_3$ layer and reduces the carbon concentration at the AlGaN surface.

TABLE 1

| Atomic Concentrations (in % using Ga3d signal) | | | | | |
|---|---|---|---|---|---|
| | C | N | O | Al | Ga3d |
| As-grown | 23.4 | 28.4 | 9.3 | 7.6 | 28.8 |
| $O_2$ Plasma-treated | 8.9 | 25.8 | 27.4 | 7.6 | 26.7 |

(Less than 2% F, Si, S, Cl were also detected)

| Oxygen Chemical State (in % of Total O) | | |
|---|---|---|
| | $Ga_2O_3$, $Ga_xO_yN_z$ | $Al_2O_3$, $Al_xO_yN_z$, AlOOH |
| As-grown | 29 | 71 |
| $O_2$ Plasma-treated | 58 | 42 |

| Gallium Chemical State (in % of Total Ga) | | |
|---|---|---|
| | $Ga_2O_3$ | AlGaN, GaN, $Ga_xO_yN_z$ |
| As-grown | 7 | 93 |
| $O_2$ Plasma-treated | 19 | 81 |

Figure 4A:
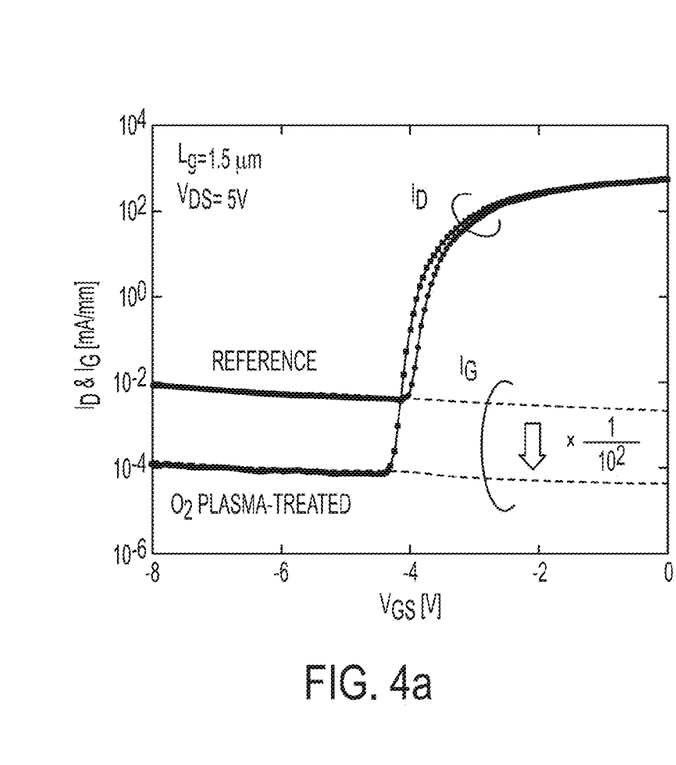
FIGS. 4a and 4b show that a plasma treatment can reduce the reverse-biased gate leakage current by two orders of magnitude and the interface trap density without substantially degrading mobility and transconductance.
Figure 4B:
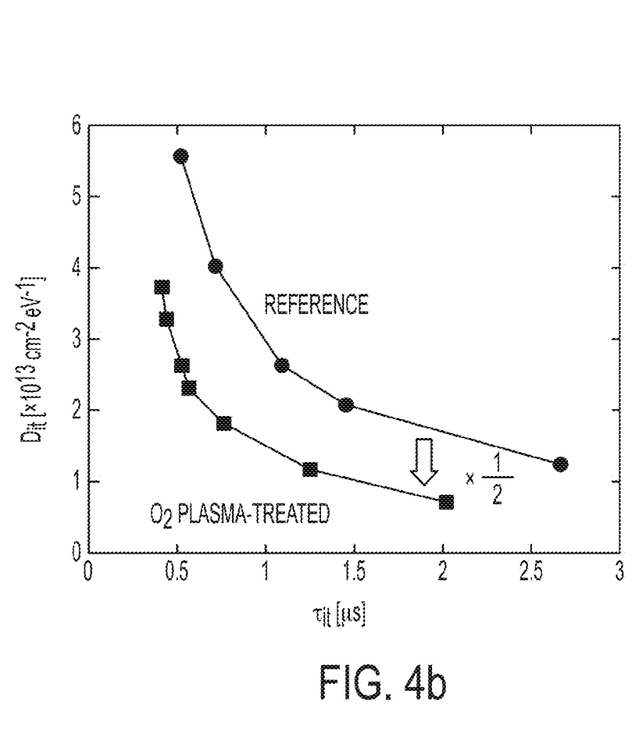
Figure 5A:
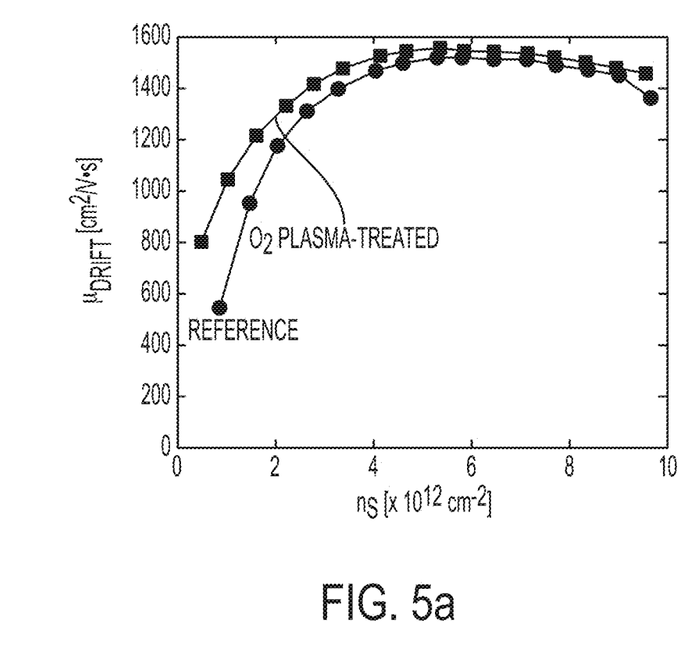
FIG. 5a shows the drift mobility as a function of the sheet carrier density in semiconductor structures with and without oxygen plasma treatment.
Figure 5B:
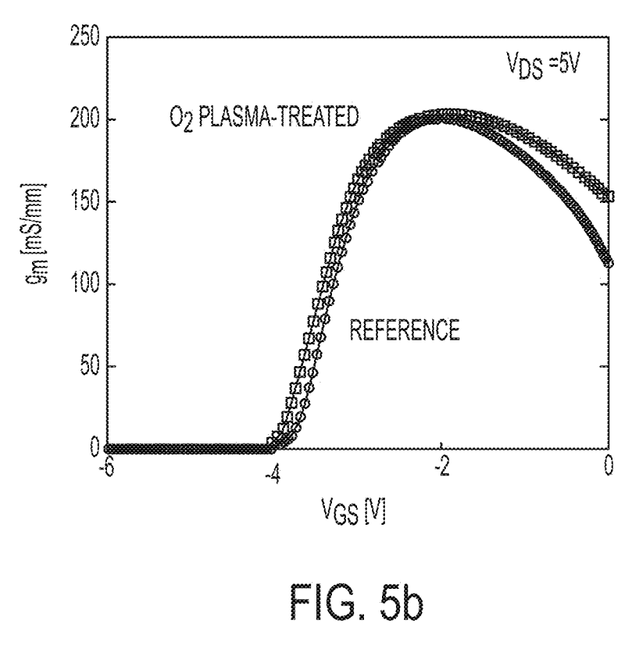
FIG. 5b shows $g_m$ as a function of the gate-source voltage for devices with and without oxygen plasma treatment.

FIGS. 4a and 4b show that such a plasma treatment can reduce the reverse-biased gate leakage current by two orders of magnitude (FIG. 4a) and the interface trap density by 50% (FIG. 4b) without degrading mobility (FIG. 5a) and transconductance (FIG. 5b). FIGS. 4a and 4b, respectively show the current-voltage (I-V) characteristics and interface trap density $D_{it}$ of AlGaN/GaN HEMTs with and without oxygen plasma treatment. The interface trap density was measured by the conductance method. The slight increase in the gate-to-channel separation due to the $Ga_2O_3$ layer (<3 nm) is responsible for the slight shift in the threshold voltage ($\Delta V_T$=0.15 V). FIG. 5a shows the drift mobility as a function of the sheet carrier density with and without oxygen plasma treatment. FIG. 5b shows $g_m$ as a function of the gate-source voltage for devices with and without oxygen plasma treatment. Significantly, the resultant HEMTs showed no degradation in intrinsic transconductance or drift mobility high frequencies (e.g., no $g_m$-collapse) and exhibited 36% higher $f_T$ than the device without oxygen plasma treatment. Part of the $f_T$ improvement is caused by the improved mobility of the oxygen plasma-treated sample, as shown in FIG. 5a.

Figure 6:
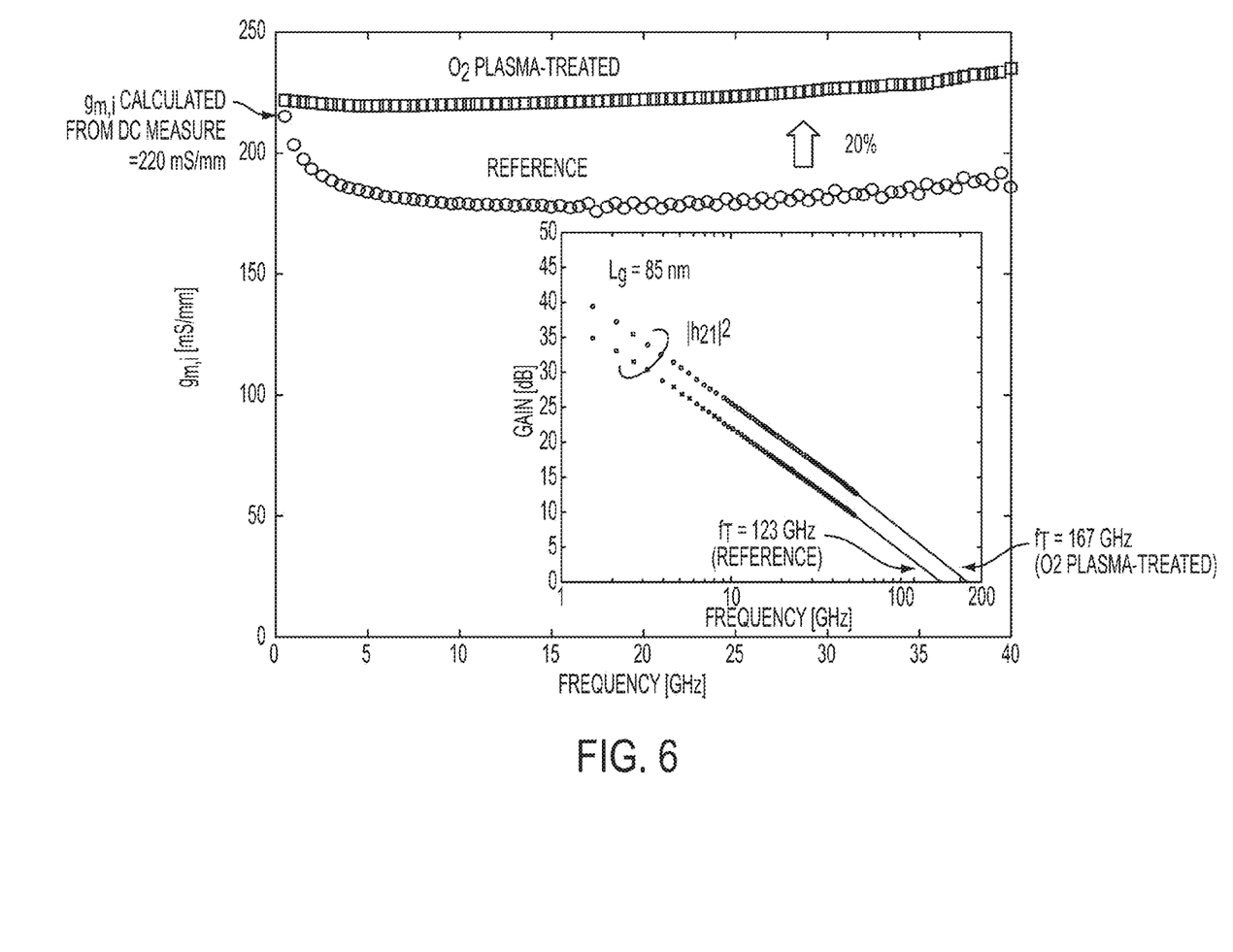
FIG. 6 shows the intrinsic RF transconductance ($g_{m,i}$) vs. frequency of AlGaN/GaN HEMTs with and without oxygen plasma treatment.

FIG. 6 shows the intrinsic RF transconductance ($g_{m,i}$) vs. frequency of AlGaN/GaN HEMTs with and without oxygen plasma treatment. $g_{m,i}$ is extracted from measured s-parameters in the range of 0.5~40 GHz. The inset shows $f_T$ for both devices. The oxygen plasma-treated sample showed 36% higher $f_T$ by preserving $g_{m,i}$, which drops without the treatment. As shown in FIG. 6, the transistor has an intrinsic small-signal transconductance that increases or at least does not substantially decrease as a frequency of operation of the transistor is increased from 0 Hz to a frequency of at least one GHz.

Figure 7A:
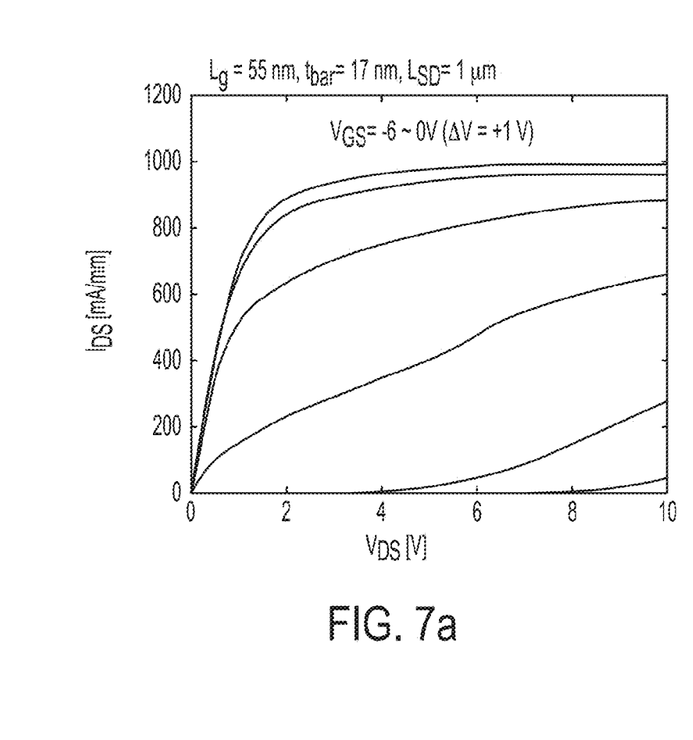
FIGS. 7a and 7b show the DC characteristics of a fabricated AlGaN/GaN HEMT.
Figure 7B:
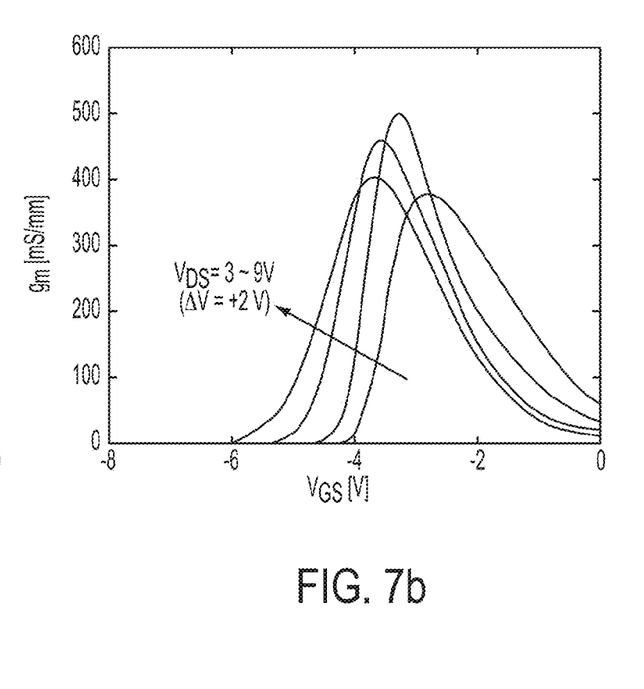

FIGS. 7a and 7b show the DC characteristics of a fabricated AlGaN/GaN HEMT with $L_g$ of 55 nm, gate-to-channel distance ($t_{bar}$) of 17 nm, and source-to-drain distance ($L_{SD}$) of 1 μm. The drop of $g_m$ for $V_{GS}$>−2 V is believed to be related to source starvation. The device exhibited excellent pinch-off, a low knee voltage of 2 V, and a high peak transconductance of 500 mS/mm. The RF performance of the same device was characterized from 0.5 to 40 GHz with a short-open-load-through (SOLT) calibration standard. A record $f_T$ of 225 GHz was obtained by extrapolating $|h_{21}|^2$ with a slope of −20 dB/dec using a least-square fit. For comparison, the highest $f_T$ reported so far in nitride transistors was 190 GHz in 6 nm barrier AlGaN/GaN HEMTs with 60-nm gate length. Devices with a $t_{bar}$ of 17 nm and an $L_g$ of 110 nm showed an $f_T$ of 162 GHz. The higher $f_T \times L_g$ product is due to the improved gate aspect ratio in these longer channel devices.

Figure 8:
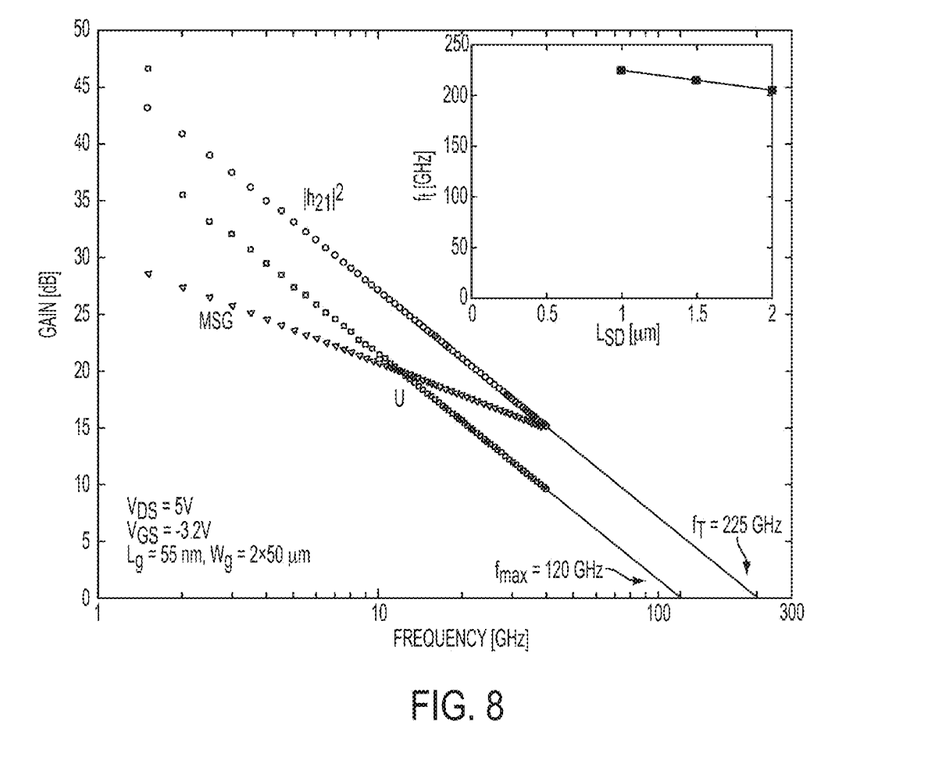
FIG. 8 shows the RF characteristics against frequency for an AlGaN/GaN HEMT.

FIG. 8 shows the RF characteristics ($|h_{21}|^2$, Mason's unilateral gain U, and MSG) against frequency for an AlGaN/GaN HEMT with $L_g$=55 nm at $V_{DS}$=5 V and $V_{GS}$=−3.2 V. The inset shows linearly increasing $f_T$ for a decreasing source-to-drain distance. The relatively low $f_{max}$ values in our devices are due to the large gate resistance ($R_g$) and output conductance ($g_{ds}$). With commonly reported $R_g$ of T-shape gates, $f_{max}$ exceeds 200 GHz. According to some embodiments, transistors can be produced having a current gain cut off frequency ($f_T$) of at least about 200 GHz.

Figure 9A:
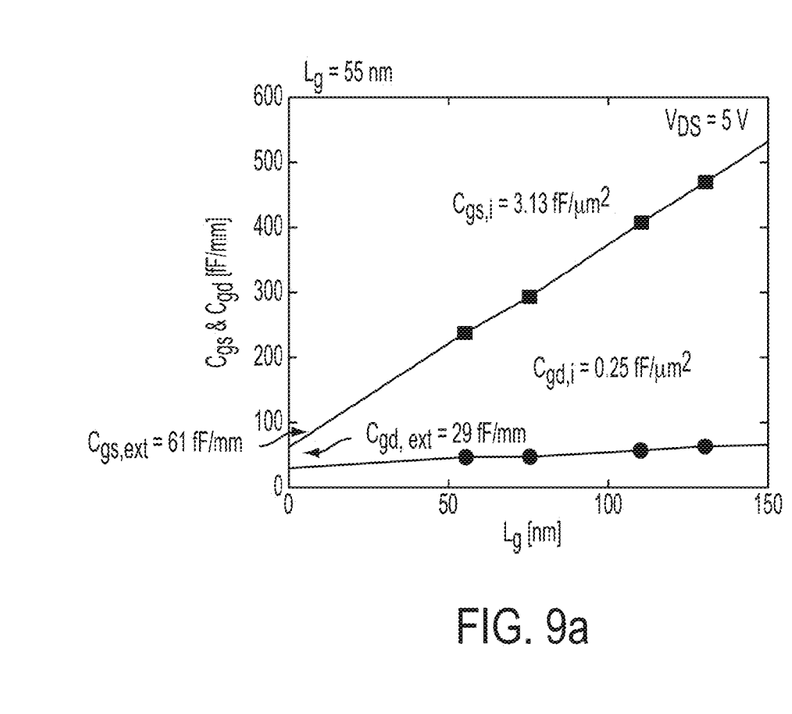
FIG. 9a shows a plot of internal gate capacitance vs. gate length
Figure 9B:
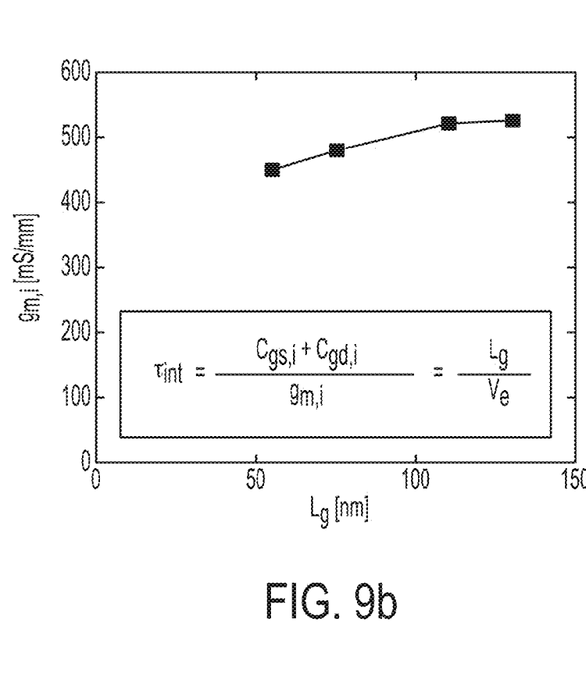
FIG. 9b shows a plot of transconductance vs. gate length.

The small-signal equivalent circuit of these devices was carefully extracted and confirmed by matching their s-parameters with Advanced Design System (ADS) software simulations. The electron velocity was calculated from the internal gate capacitances and intrinsic transconductance as a function of $L_g$. Internal gate capacitances ($C_{gs,i}$, $C_{gd,i}$) without external gate fringing capacitances ($C_{gs,ext}$, $C_{gd,ext}$) were obtained from the scaling behavior of extracted $C_{gs}$ and $C_{gd}$, as shown in FIG. 9a. The intrinsic electron velocity ($v_e$) is calculated from $C_{gs,i}$, $C_{gd,i}$, and $g_{m,i}$ at a given $L_g$ following the equation of intrinsic delay, $\tau_{int}$ (FIG. 9b).

Figure 10A:
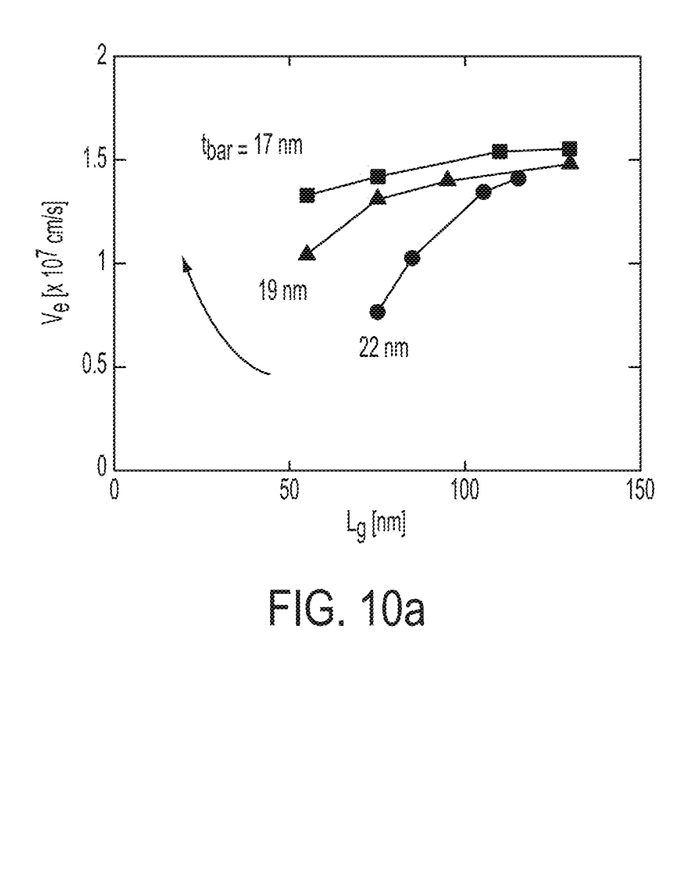
FIG. 10a shows that the electron velocity monotonically increases with reducing $t_{bar}$, resulting in $f_T$ improvement, as illustrated in FIG. 10b.
Figure 10B:
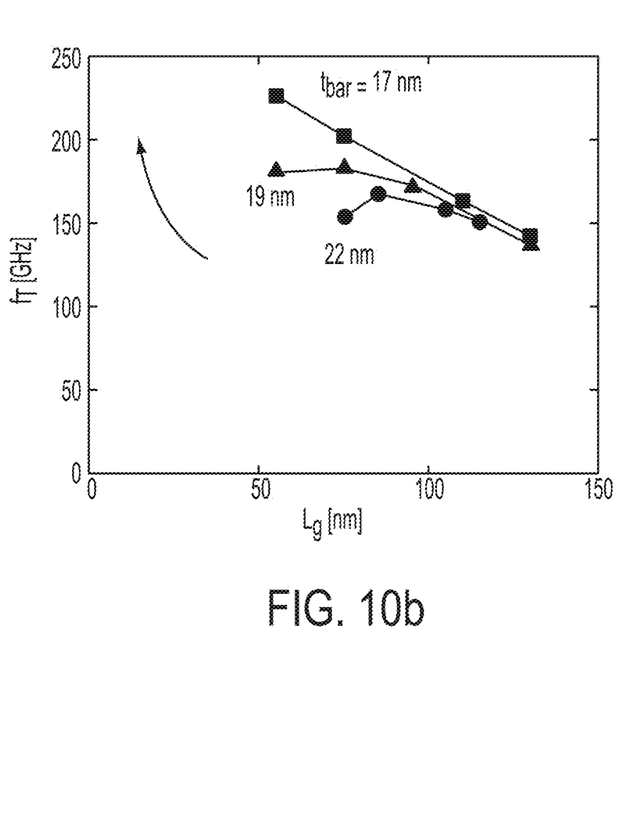

As shown in FIG. 10a, the electron velocity monotonically increases with reducing $t_{bar}$, resulting in $f_T$ improvement, as shown in FIG. 10b. Also, in the devices with lower $t_{bar}$, we observed less roll-off in $v_e$ and $f_T$ when scaling $L_g$, indicating that the short-channel effects are mitigated as the devices are vertically scaled.

Figure 11A:
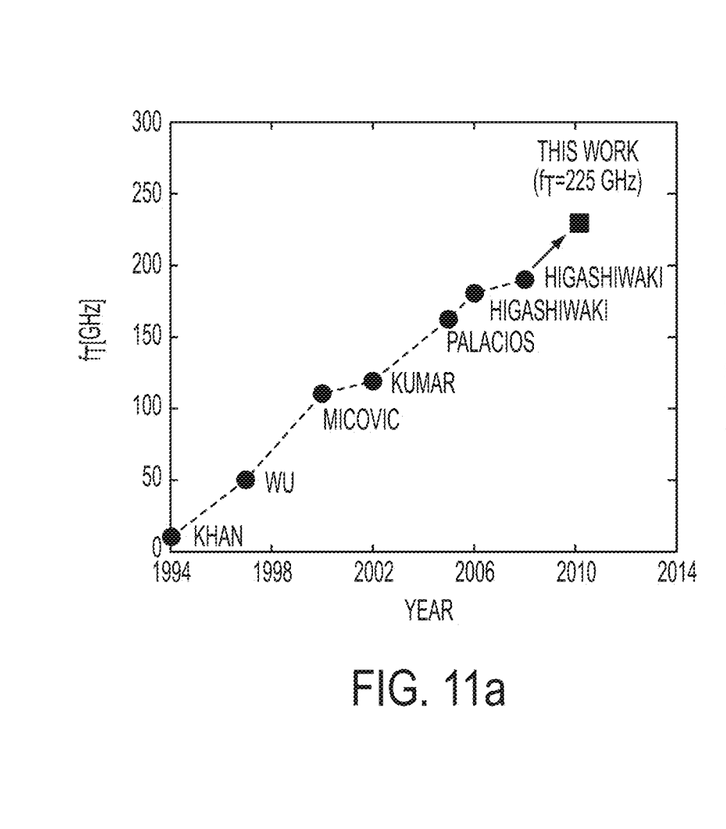
FIGS. 11a and 11b benchmark the frequency performance of the exemplary devices against previous data in the literature.
Figure 11B:
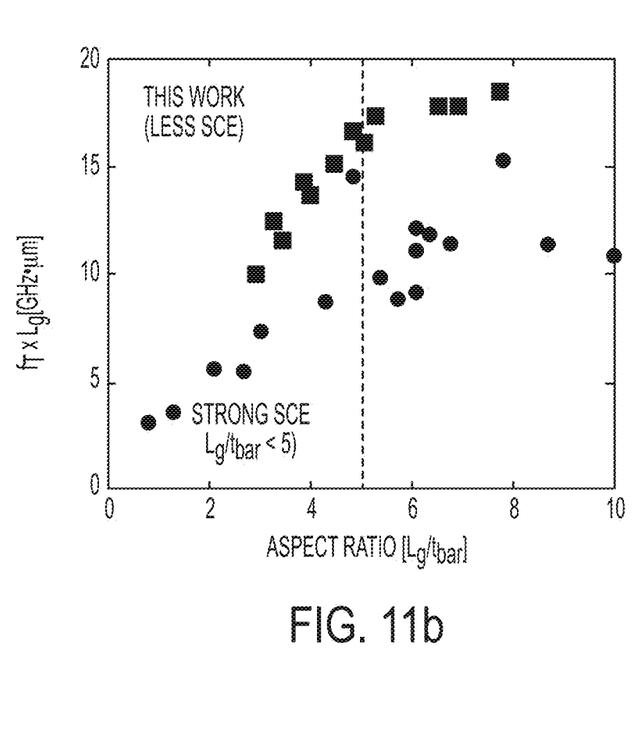

FIGS. 11a and 11b benchmark the frequency performance of the devices obtained in this work against previous data in the literature, with squares showing the performance of our devices and circles showing the performance of previous devices. FIG. 11a shows the evolution of $f_T$ for the past 15 years. FIG. 11b shows the benchmark of the $f_T \times L_g$ products with data found in the literature as a function of aspect ratio. A record $f_T$ is reported and less short-channel effect (SCE) is observed due to the higher $f_T$ obtained in this work.

We have demonstrated $L_g$=55 nm gate-recessed and oxygen plasma-treated AlGaN/GaN HEMTs with a record $f_T$ of 225 GHz. To achieve this high $f_T$, we combined a scaled geometry with a novel surface treatment (e.g., oxygen plasma treatment) to simultaneously reduce short-channel effects and $g_m$-collapse, and increase the modulation efficiency of the gate electrode. This new technology can increase the average electron velocity in GaN HEMTs by 40% and uncovers the unsurpassed potential of GaN transistors for very high frequency applications.

Although exemplary HEMTs have been described above, the techniques described herein are not limited to HEMTs, as they may be used in other suitable transistors or other devices. These devices include metal-oxide-semiconductor field effect transistors (MOSFETs), metal-oxide-insulator field effect transistors (MISFETs), metal-oxide-semiconductor heterostructure field effect transistors (MOSHFETs), metal-insulator-semiconductor heterostructure field effect transistors (MISHFETs), junction field effect transistors (JFETs), and other field effect transistors, as well as bipolar transistors, light emitting diodes and lasers, by way of example.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A transistor, comprising:
   a nitride semiconductor layer having a surface-treated region formed thereon, wherein the surface-treated region comprises a layer that includes oxygenated material; and
   a gate formed over and/or adjacent to at least a portion of the surface-treated region,
   wherein the transistor has an intrinsic small-signal transconductance that increases or at least does not substantially decrease as a frequency of operation of the transistor is increased from 0 Hz to a frequency of at least one GHz.

2. The transistor of claim 1, wherein the surface-treated region comprises a plasma-treated region.

3. The transistor of claim 2, wherein the plasma-treated region comprises an oxygen plasma treated region.

4. The transistor of claim 1, wherein the transistor comprises a HEMT, a MOSHFET, a MISHFET, a JFET or a HFET.

5. The transistor of claim 1, wherein the oxygenated material comprises a gallium oxide material.

6. The transistor of claim 1, wherein the transistor has an intrinsic small-signal transconductance that increases or at least does not substantially decrease as a frequency of operation of the transistor is increased from 0 Hz to a frequency of at least 40 GHz.

7. The transistor of claim 1, wherein the gate covers substantially all of the surface-treated region.

8. The transistor of claim 1, wherein the surface-treated region is formed in an access region outside of a region covered by the gate, and the surface-treated region is not covered by the gate.

9. The transistor of claim 1, wherein the gate comprises a first layer and a second layer, wherein the second layer is formed over the first layer and the first layer is formed over the surface-treated region, and wherein a portion of the second layer extends beyond an edge of the first layer.

10. The transistor of claim 1, wherein the gate is formed over the at least a portion of the surface-treated region.

11. The transistor of claim 1, wherein the gate is formed adjacent to the at least a portion of the surface-treated region.

12. The transistor of claim 1, wherein the gate is formed over and adjacent to the at least a portion of the surface-treated region.

13. A transistor, comprising:
    a nitride semiconductor layer having a surface-treated region formed thereon using at least one of oxygen plasma, hydrogen plasma, boron chloride plasma, chlorine plasma, UV ozone cleaning and plasma-assisted high-k dielectric deposition; and
    a gate formed over and/or adjacent to at least a portion of the surface-treated region,
    wherein an intrinsic small signal transconductance and/or electron velocity of the transistor does not substantially decrease as an operating frequency of the transistor is increased to a frequency of at least one GHz, and
    wherein the surface-treated region comprises a layer that includes oxygenated material.

14. The transistor of claim 13, wherein the surface-treated region comprises a plasma-treated region.

15. The transistor of claim 14, wherein the plasma-treated region comprises an oxygen plasma treated region.

16. The transistor of claim 13, wherein the transistor comprises a HEMT, a MOSHFET, a MISHFET, a JFET or a HFET.

17. The transistor of claim 13, wherein the oxygenated material comprises a gallium oxide material.

18. The transistor of claim 13, wherein the gate covers substantially all of the surface-treated region.

19. The transistor of claim 13, wherein the surface-treated region is formed in an access region outside of a region covered by the gate, and the surface-treated region is not covered by the gate.

20. The transistor of claim 13, wherein the gate comprises a first layer and a second layer, wherein the second layer is formed over the first layer and the first layer is formed over the surface-treated region, and wherein a portion of the second layer extends beyond an edge of the first layer.

21. The transistor of claim 13, wherein the gate is formed over the at least a portion of the surface-treated region.

22. The transistor of claim 13, wherein the gate is formed adjacent to the at least a portion of the surface-treated region.

23. The transistor of claim 13, wherein the gate is formed over and adjacent to the at least a portion of the surface-treated region.

24. A transistor, comprising:
    a nitride semiconductor layer having a surface-treated region formed thereon, wherein the surface-treated region comprises a layer that includes oxygenated material; and
    a gate formed over and/or adjacent to at least a portion of the surface-treated region,
    wherein a current gain cut off frequency ($f_T$) of the transistor is at least about 200 GHz.

25. The transistor of claim 24, wherein the layer that includes oxygenated material comprises a plasma-treated region.

26. The transistor of claim 25, wherein the plasma-treated region comprises an oxygen plasma treated region.

27. The transistor of claim 24, wherein the transistor comprises a HEMT, a MOSHFET, a MISHFET, a JFET or a HFET.

28. The transistor of claim 24, wherein the oxygenated material comprises a gallium oxide material.

29. The transistor of claim 24, wherein the gate covers substantially all of the surface-treated region.

30. The transistor of claim 24, wherein the surface-treated region is formed in an access region outside of a region covered by the gate, and the surface-treated region is not covered by the gate.

31. The transistor of claim 24, wherein the gate comprises a first layer and a second layer, wherein the second layer is formed over the first layer and the first layer is formed over the surface-treated region, and wherein a portion of the second layer extends beyond an edge of the first layer.

32. The transistor of claim 24, wherein the gate is formed over the at least a portion of the surface-treated region.

33. The transistor of claim 24, wherein the gate is formed adjacent to the at least a portion of the surface-treated region.

34. The transistor of claim 24, wherein the gate is formed over and adjacent to the at least a portion of the surface-treated region.

* * * * *